(12) United States Patent
Kim et al.

(10) Patent No.: US 8,463,988 B2
(45) Date of Patent: Jun. 11, 2013

(54) SYSTEM AND METHOD FOR MATCHING PATTERNS

(75) Inventors: Junghak Kim, Daejeon (KR); Song In Choi, Daejeon (KR); Jee Hwan Ahn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 724 days.

(21) Appl. No.: 12/629,478

(22) Filed: Dec. 2, 2009

(65) Prior Publication Data

US 2010/0138599 A1    Jun. 3, 2010

(30) Foreign Application Priority Data

Dec. 3, 2008 (KR) .......................... 10-2008-0121998
Aug. 26, 2009 (KR) .......................... 10-2009-0079439

(51) Int. Cl.
*G06F 12/00* (2006.01)

(52) U.S. Cl.
USPC ........................................................ 711/108

(58) Field of Classification Search
None
See application file for complete search history.

(56) References Cited

U.S. PATENT DOCUMENTS

| 7,082,044 B2 | 7/2006 | Gould et al. |
| 7,353,332 B2 | 4/2008 | Miller et al. |
| 2002/0196648 A1* | 12/2002 | Gordon et al. ................. 365/49 |

OTHER PUBLICATIONS

"High Speed Pattern Matching for Deep Packet Inspection," Junghak Kim et al., In ISCIT 2009 (International Symposium on Communication and Information Technology 2009), Sep. 29, 2009, pp. 1310-1315.

* cited by examiner

*Primary Examiner* — Shawn X Gu
(74) *Attorney, Agent, or Firm* — Staas & Halsey LLP

(57) ABSTRACT

A pattern matching system detects strings contained in a target pattern to be detected within a data stream input by 1-byte data, and detects a regular expression representing the target pattern among regular expressions constructed by the detected strings.

20 Claims, 11 Drawing Sheets

| String | String ID |
|---|---|
| High | 1 |
| Speed | 2 |
| Performance | 3 |
| System | 4 |
| Network | 5 | ed
SYSTEM AND METHOD FOR MATCHING PATTERNS

CROSS-REFERENCE TO RELATED APPLICATION

This application claims priority to and the benefit of Korean Patent Application No. 10-2008-0121998 and 10-2009-0079439 filed in the Korean Intellectual Property Office on Dec. 3, 2008, and Aug. 26, 2009, respectively, the entire contents of which are incorporated herein by reference.

BACKGROUND OF THE INVENTION (a) Field of the Invention

The present invention relates to a pattern matching system and a pattern matching method, and more particularly, to a system and a method for matching a pattern with a data packet processed at a high speed in a communication network equipment or system.

(b) Description of the Related Art

A communication network has evolved while newly creating a large number of services, and the requirements of users have been diversified more and more. In this connection, very much information is generated, eliminated, or stored in the network. Some of such information is security-related, and techniques thereof have also been developed. Information security threatening factors have recently appeared in networks in complicated and diversified manners. Furthermore, network accessed networking equipment and communication terminals are variously provided with functions for detecting and preventing such threatening factors. The network threatening factors may appear throughout all the layers of packets transmitted through the network. Particularly, the data should be analyzed from first to last in order to detect the factors appearing in the application layer.

Pattern matching is utilized in order to find specific information from the application layer data. That is, the application layer data are detected so as to judge whether there is a pattern to be matched with desired specific information. As the location of target information is not predetermined, the information retrieval may be terminated within a very short period of time, or occasionally continue up to the last data.

The pattern matching may be classified into two types. The first is to detect a pattern in a software manner by utilizing various forms of central processing units and memories. It is very easy with this technique to design an algorithm and to realize the algorithm in a software manner. However, such a technique depends upon the data processing speed of the central processing unit and the memory, and is somewhat limited in processing data at a high speed because it is not easy therewith to do the data processing in parallel. In order to overcome such a limitation, the second type is to detect a pattern in a hardware manner by using a content addressable memory (CAM). Such a technique utilizes the parallel processing function of the CAM, which includes a plurality of entries. The respective entries include a memory capable of storing the target data, and a comparator capable of comparing the data stored at the memory with the data input into the CAM. Furthermore, the data input into the CAM are compared with the data stored at all the entries belonging to the CAM simultaneously. With the usage of such a function of the CAM, the data may be processed at a higher speed in retrieving the specific information from the application layer data.

The pattern matching system usually includes techniques of detecting a pattern to be generated by way of a combination of strings, not being limited to the detection of simple strings. The representative is a regular expression matching technique. A regular expression is established by converting particular word sets or strings into symbols, and is used in designating an expression rule for correctly expressing a set of strings, a linguistic grammar definition, and a string to be detected.

With a conventional pattern matching system conducting the string matching for detecting strings contained in the entries of a single CAM and the regular expression matching for detecting a regular expression constructed by the detected strings, the larger the number of strings contained in the target pattern to be detected is and the longer the length of the strings contained in the target pattern is, the more rapidly state transitions pursuant to the regular expression matching increase, and accordingly, the memory included in the CAM and the memory used for the state transitions need to be significantly increased.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a pattern matching system and a pattern matching method having advantages of using a memory in an efficient manner.

An exemplary embodiment of the present invention provides a method of matching a pattern at a pattern matching system. The pattern matching method includes detecting strings contained in a target pattern to be detected within a data stream input by 1-byte data, delaying the input 1-byte data, generating pattern keys by using the detected strings and the delayed 1-byte data, and detecting a regular expression representing the target pattern among regular expressions constructed by the generated pattern keys.

Another exemplary embodiment of the present invention provides a pattern matching system. The pattern matching system includes a string matching unit, a delay unit, a key generator, and a regular expression matching unit. The string matching unit detects strings contained in a target pattern to be detected within a data stream input by 1-byte data. The delay unit delays the input 1-byte data. The key generator generates pattern keys by using the detected strings and the 1-byte data. The regular expression matching unit detects a regular expression representing the target pattern to be detected among regular expressions constructed by the pattern keys.

With an exemplary embodiment of the present invention, the memory required for the pattern matching system can be used more efficiently, and the string matching and the regular expression matching are conducted separately so that only one matching part can be extended when needed.

DETAILED DESCRIPTION OF THE EMBODIMENTS

Figure 1:
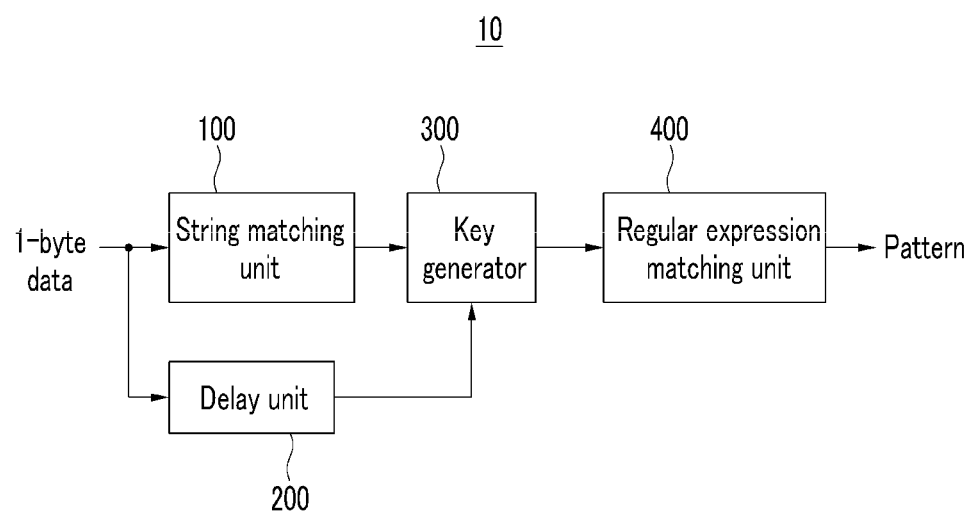
FIG. 1 illustrates a pattern matching system according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, unless explicitly described to the contrary, the word "comprise" and variations such as "comprises" or "comprising" will be understood to imply the inclusion of stated elements but not the exclusion of any other elements throughout the specification. The terms "-er," "-or," and "module" described in the specification mean units for processing at least one function or operation, which can be implemented by hardware components, software components, or combinations thereof.

A pattern matching system and a pattern matching method according to an exemplary embodiment of the present invention will now be described in detail with reference to the accompanying drawings.

Application layer data are usually formed with characters such as ASCII characters, which are composed of 1-byte data, and in this exemplary embodiment of the present invention, the pattern matching system and method will be described by taking the case where the data are input as 1-byte data.

With the present invention, the string means a sequential string of temporally-sequenced characters. Furthermore, with the present invention, the pattern means a form expressed by the combination of characters and strings. For example, "Pattern Matching" or "Network Security" may be a string to be found in the phrase "A High Speed and Performance Pattern Matching System for Network Security."

Furthermore, the latter phrase may be on the whole treated as a string. By contrast, the string "High Speed System" is not existent in that phrase. However, the string "High Speed System" may be viewed as a pattern formed by a combination of the two strings to be found therein, "High Speed" and "System."

FIG. 1 illustrates a pattern matching system according to an exemplary embodiment of the present invention.

Referring to FIG. 1, a pattern matching system 10 according to an exemplary embodiment of the present invention includes a string matching unit 100, a delay unit 200, a key generator 300, and a regular expression matching unit 400.

The string matching unit 100 detects whether characteristic strings are present within the data stream input by 1-byte, and outputs the detected strings to the key generator 300. Here, the characteristic strings are contained in the pattern to be finally found.

The delay unit 200 delays the data stream input by 1-byte by the time consumed for processing the 1-byte data stream at the string matching unit 100, and outputs the delayed 1-byte data stream to the key generator 300. The delay unit 200 may be formed with a buffer where a series of flip-flops are interconnected.

That is, the delay unit 200 may delay the data stream by 1 clock through using a 1-byte buffer when the time consumed for processing the 1-byte data stream at the string matching unit 100 is 1 clock, while the delay unit 200 delays the data stream by 2 clocks through using a 2-byte buffer when the time consumed for processing the 1-byte data stream at the string matching unit 100 is 2 clocks. Here, the clock means a basic unit time required for mechanically operating the pattern matching system 10 according to an exemplary embodiment of the present invention.

The key generator 300 generates pattern keys containing the strings detected by the string matching unit 100, and the 1-byte data stream delayed by the delay unit 200.

The regular expression matching unit 400 detects whether there is a regular expression representing the target pattern among the regular expressions formed with the pattern keys generated by the key generator 300. Here, the regular expression is composed of the pattern keys to be generated from the key generator 300, and the pattern to be targeted is capable of being expressed by the regular expression.

Figure 2:
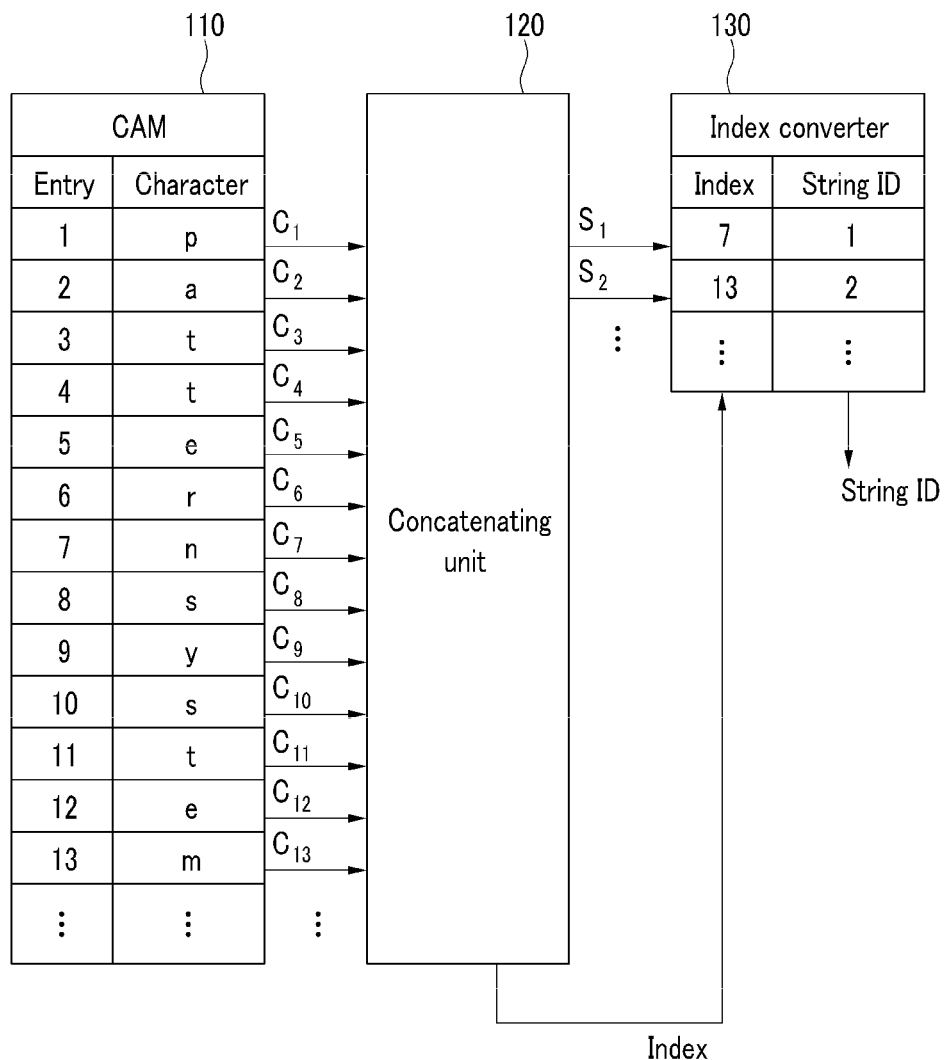
FIG. 2 illustrates the string matching unit shown in FIG. 1.

FIG. 2 illustrates a string matching unit shown in FIG. 1.

Referring to FIG. 2, the string matching unit 100 includes a content addressable memory (referred to hereinafter simply as "CAM") 110 being an associative memory, a concatenating unit 120, and an index converter 130.

The CAM 110 includes a plurality of entries. A character is stored at each entry as a content.

The CAM 110 receives a 1-byte data stream, and compares the input 1-byte data stream with all the contents stored at the respective entries simultaneously. When any entries storing the matched contents are existent, the CAM 110 generates hit signals $C_1, C_2, \ldots$ corresponding to those entries. Here, the 1-byte data stream input into the CAM 110 may be expressed by characters. The characters contained in the characteristic strings are sequentially stored at the entries of the CAM 110. Accordingly, when the characteristic strings are detected by using the CAM 110, the entries of the CAM 110 storing the characters contained in the strings sequentially output the hit signals $C_1, C_2, \ldots$.

For example, when it is intended to detect the string "pattern" as shown in FIG. 2, the characters contained in the string "pattern" are sequentially stored at the CAM 110. Even though the same character like "t" is repeated several times, all the respective characters are stored at the relevant entries of the CAM 110. Thereafter, the string "pattern" is input into the CAM 110 by 1-byte data, and the entries of the CAM 110 storing the characters contained in the string "pattern" sequentially output the hit signals $C_1, C_2, \ldots, C_7$.

Meanwhile, the CAM 110 according to an exemplary embodiment of the present invention may be a ternary CAM (TCAM). The TCAM has a function of making the entry be a "don't care" term. For example, when it is intended to detect all the 3-byte strings beginning from the character "a," the content "a" is stored at an entry of the TCAM, while making the successive entries be the don't care terms. In this case, with the TCAM where the string of "a**" is input, the entry storing the character "a" and the successive two entries storing the "don't care" terms sequentially output hit signals.

Here, the character "*" indicates the "don't care" term. The "don't care" term means that any character may appear at that location.

The concatenating unit 120 logically combines the hit signals $C_1, C_2, \ldots$ sequentially output from the respective entries of the CAM 110 storing the characters contained in the characteristic string, and generates detection signals $S_1, S_2, \ldots$ informing that the characteristic string is detected. That is, the characters of the target string from the first to last are temporally generated in a sequential manner, and the concatenating unit 120 generates the detection signals $S_1, S_2, \ldots$ informing that the target string is detected, respectively.

Furthermore, the concatenating unit 120 converts the generated detection signals $S_1, S_2, \ldots$ into indexes, and outputs them to the index converter 130.

Figure 3:
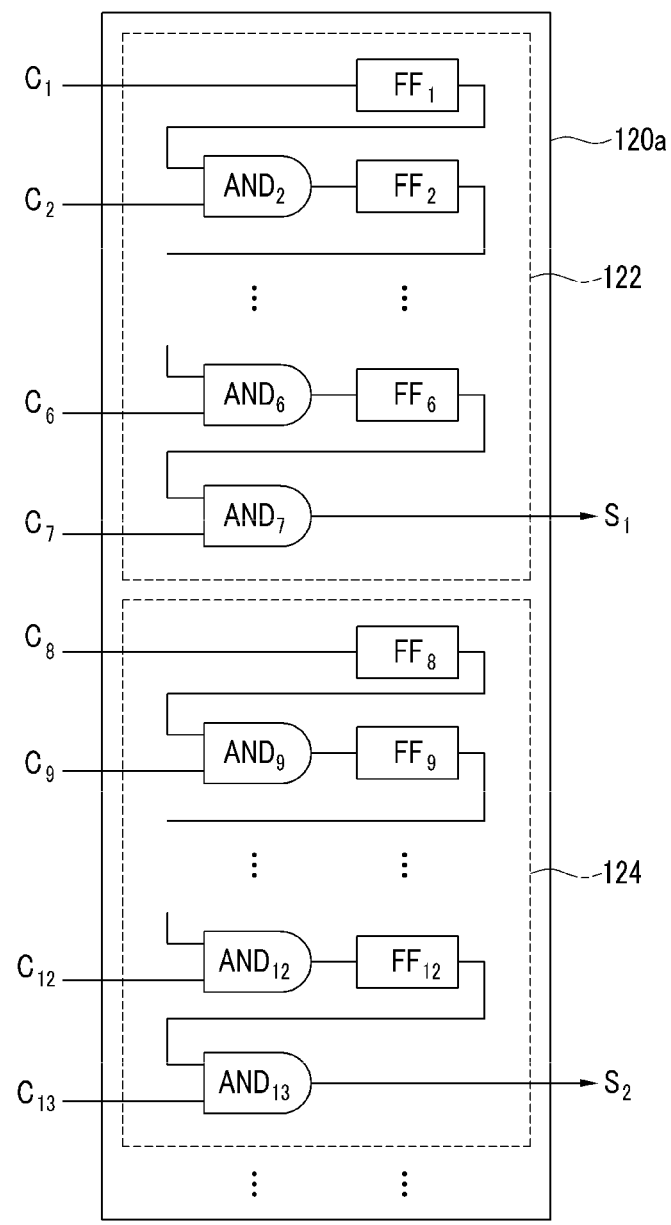
FIG. 3 illustrates an example of the concatenating unit shown in FIG. 2.

FIG. 3 illustrates the concatenating unit shown in FIG. 2. FIG. 3 illustrates the concatenating unit 120a while assuming that the hit signals $C_1, C_2, \ldots C_{13}$ to be sequentially output from the respective entries of the CAM 110 storing the characters contained in the strings "pattern" and "system" are output.

Referring to FIG. 3, the concatenating unit 120a includes a plurality of concatenating circuits 122 and 124 corresponding to the strings to be detected.

The concatenating circuits 122/124 have a plurality of input terminals receiving the hits signals $C_1, C_2, \ldots C_7/C_8, C_9, \ldots C_{13}$ output corresponding to the respective characters of the relevant string respectively, and output terminals for outputting detection signals $S_1$ and $S_2$ to inform of the detection of the relevant string.

The concatenating circuits 122/124 have a plurality of flip-flops $FF_1$-$FF_6$/$FF_8$-$FF_{12}$ and a plurality of AND gates $AND_2$-$AND_7$/$AND_9$-$AND_{13}$. The output terminal of the respective flip-flops $FF_1$-$FF_6$/$FF_8$-$FF_{12}$ is connected to one of the two input terminals (referred to hereinafter as "first input terminal") of the respective AND gates $AND_2$-$AND_7$/$AND_9$-$AND_{13}$, and the output terminal of the respective AND gates $AND_2$-$AND_7$/$AND_9$-$AND_{13}$ is connected to the input terminal of the respective flip-flops $FF_2$-$FF_6$/$FF_9$-$FF_{12}$. At this time, the hit signals $C_1$-$C_7$/$C_8$-$C_{13}$ corresponding to the first to last characters of the relevant string are input to the input terminal of the foremost-positioned flip-flop $FF_1$/$FF_8$ among the flip-flops $FF_1$-$FF_6$/$FF_8$-$FF_{12}$, and the other input terminal (referred to hereinafter as "second input terminal") of the respective AND gates $AND_2$-$AND_7$/$AND_9$-$AND_{13}$. And the output terminals of the last-positioned AND gates $AND_7$/$AND_{13}$ among the AND gates $AND_2$-$AND_7$/$AND_9$-$AND_{13}$ form the output terminal of the concatenating circuits 122/124.

The flip-flops $FF_1$-$FF_6$/$FF_8$-$FF_{12}$) delay the data input into the input terminal by 1 clock unit, and output them to the output terminal. The AND gates $AND_2$-$AND_7$/$AND_9$-$AND_{13}$ AND-calculate the data input into the first and second input terminals, that is, the signals output to the output terminal of the flip-flops $FF_1$-$FF_6$/$FF_8$-$FF_{12}$) by the hit signals $C_2$-$C_7$/$C_8$-$C_{13}$, and output the product.

For example, as shown in FIG. 2, the characters of the strings like "pattern" and "system" are stored at the entries of the CAM 110, and when the input string is "pattern," the hit signals $C_1$-$C_7$ are sequentially output from the respective entries of the CAM 110. First, when "p" is input, the hit signal $C_1$ is output to the flip-flop $FF_1$. The flip-flop $FF_1$ delays the hit signal $C_1$ until the next 1-byte data is input, and outputs it to the AND gate $AND_2$. Thereafter, when "a" is input, the hit signal $C_2$ is output to the AND gate $AND_2$, and the AND gate $AND_2$ AND-calculates the hit signal $C_2$ by the hit signal $C_1$ output from the flip-flop $FF_1$ so as to output the product to the flip-flop $FF_2$. Then, the flip-flop $FF_2$ delays the product of hit signals $C_1$ and $C_2$ until the next 1-byte data is input, and outputs it to the AND gate $AND_3$. In this way, when the concatenating circuit 122 is operated until the last character "n" of the string "pattern" is input, the hit signals $C_1$-$C_7$ corresponding to all the characters of the string "pattern" are AND-calculated, and the product is output to the output terminal of the AND gate $AND_7$, and becomes the detection signal $S_1$.

Meanwhile, with the concatenating unit 120a shown in FIG. 3, when the target strings to be detected are determined, the flip-flops $FF_1$-$FF_6$/$FF_8$-$FF_{12}$ and the AND gates $AND_2$-$AND_7$/$AND_9$-$AND_{13}$ are interconnected depending upon the target strings so as to generate a concatenating circuit 122/124 corresponding to the respective strings. Accordingly, the boundary between the target two strings is made clearly. However, with the concatenating unit 120a shown in FIG. 3, a new concatenating circuit is required whenever a new string is added. It may be very simple to conduct such an operation in a software manner, while it is very troublesome or impossible to conduct such an operation in a hardware manner. For example, when the concatenating circuits 122 and 124 are formed with field programmable gate arrays (FPGA), whenever a new concatenating circuit is added, all the functions of the FPGA should be stopped and re-operated after the newly-coined code is programmed at the FPGA. This is excessively troublesome. Accordingly, the concatenating unit 120 should be structured to be easily programmable together with the CAM 110.

Figure 4:
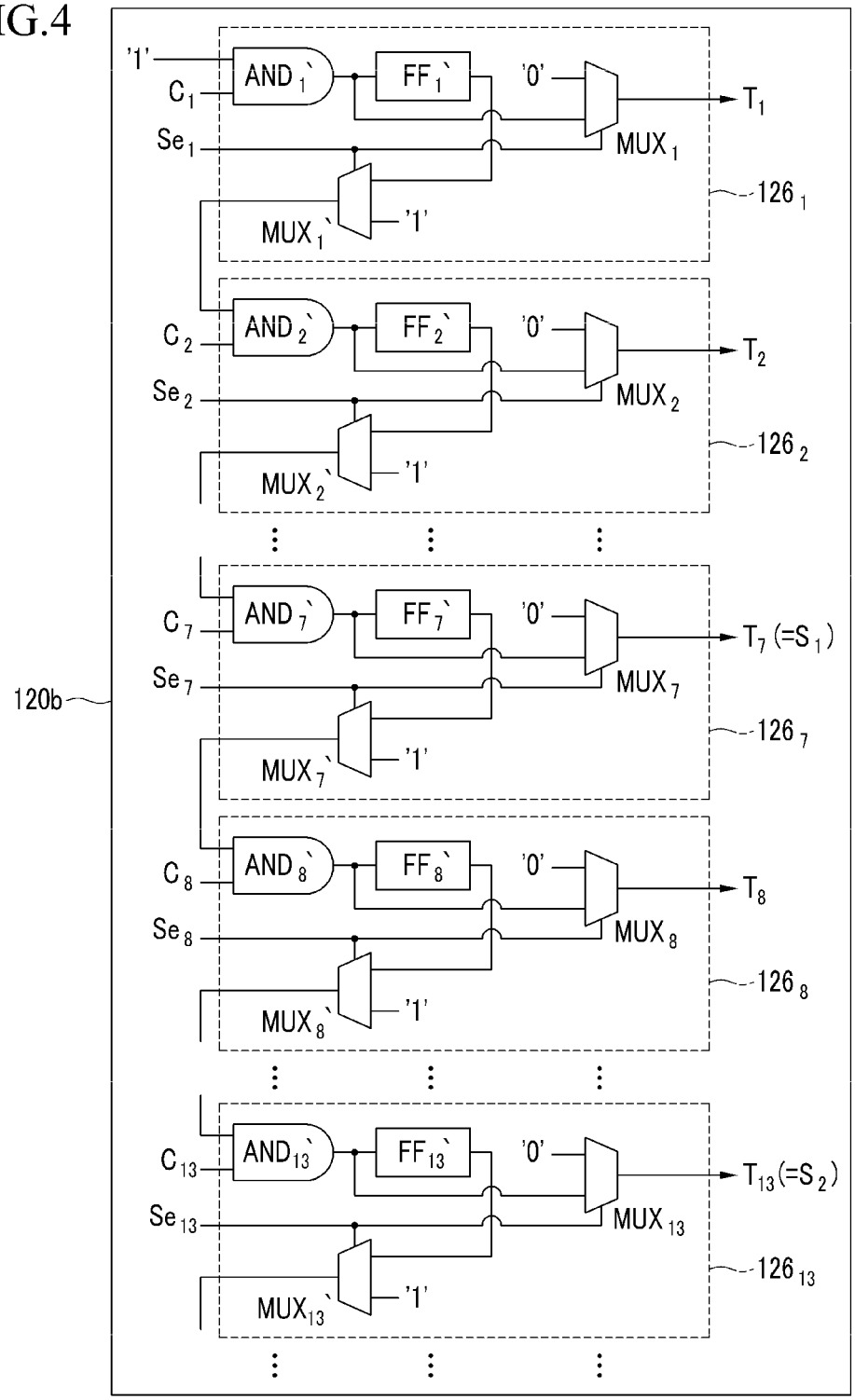
FIG. 4 illustrates another example of the concatenating unit shown in FIG. 2.

FIG. 4 illustrates another example of the concatenating unit shown in FIG. 2.

Referring to FIG. 4, the concatenating unit 120b includes a plurality of stages $126_1$-$126_{13}$. The respective stages $126_1$-$126_{13}$ have two input terminals, two output terminals, and a control terminal. One of the two input terminals of the respective stages $126_1$-$126_{13}$ (referred to hereinafter as "first input terminal") is connected to one of the two output terminals of the stage neighboring thereto (referred to hereinafter as "first output terminal"). And the hit signals $C_1$-$C_{13}$ corresponding to the respective characters of the target string are sequentially input into the other input terminal of the respective stages $126_1$-$126_{13}$ (referred to hereinafter as "second input terminal"). Control signals $Se_1$-$Se_{13}$ are input into the control terminals, and the detection signals $S_1$ and $S_2$ are output to the other output terminal of the respective stages $126_1$-$126_{13}$ (referred to hereinafter as "second output terminal").

The stages $126_1$/ . . . /$126_{13}$ include an AND gate $AND_1'$/ . . . /$AND_{13}'$, a flip-flop $FF_1'$/ . . . /$FF_{13}'$, a first multiplexer $MUX_1$/ . . . /$MUX_{13}$, and a second multiplexer $MUX_1'$/ . . . /$MUX_{13}'$. For example, with the stage $126_2$, the first input terminal of the AND gate $AND_2'$ forms the first input terminal of the stage $126_2$, and the second input terminal of the AND gate $AND_2'$ forms the second input terminal of the stage $126_2$. The output terminal of the AND gate $AND_2'$ is connected to the input terminal of the flip-flop ($FF_2'$) and the second input terminal of the multiplexer $MUX_2$, and the output terminal of the flip-flop $FF_2'$ is connected to the first input terminal of the multiplexer $MUX_2'$. The data "0" is input into the first input terminal of the multiplexer $MUX_2$, and the data "1" is input into the second input terminal of the multiplexer $MUX_2'$. The output terminal of the multiplexer $MUX_2'$ forms the first output terminal of the stage $126_2$, and the output terminal of the multiplexer $MUX_2$ forms the second output terminal of the stage $126_2$. A control signal $Se_2$ is input into the control terminal of the multiplexer $MUX_2$, $MUX_2'$.

The remaining stages $126_1$/$126_3$/ . . . /$126_{13}$ may be constructed in the same way as the stage $126_2$. The data "1" is input into the first input terminal of the AND gate $AND_1'$ of the foremost-positioned stage $126_1$ among the stages $126_1$-$126_{13}$, while it is possible for the AND gate $AND_1'$ to be omitted with the stage $126_1$, and the hit signal $c_1$ is input into the input terminal of the flip-flop $FF_1'$ and the second input terminal of the multiplexer $MUX_1$.

With the above-like structured concatenating unit 120b, the strings may be distinguished in boundary from each other by way of the control signals $Se_1$-$Se_{13}$.

For example, assume that when the control signals $Se_1$-$Se_{13}$ are "1," the multiplexers $MUX_1$-$MUX_{13}$, $MUX_1'$-$MUX_{13}'$ output the data of the second input terminal, while when the control signals $Se_1$-$Se_{13}$ are "0," the multiplexers $MUX_1$-$MUX_{13}$, $MUX_1'$-$MUX_{13}'$ output the data of the first input terminal. As the multiplexer $MUX_1'$ outputs the data of the first input terminal when the control signal $Se_1$ is "1," the output terminal of the flip-flop $FF_1'$ is connected to the first input terminal of the AND gate $AND_2'$ so as to form a concatenating circuit.

By contrast, as the multiplexer $MUX_1'$ outputs the data of the second input terminal when the control signal $Se_1$ is "0," the output terminal of the flip-flop $FF_1'$ and the input terminal of the AND gate $AND_2'$ are not connected with each other. That is, the stage $126_1$ and the stage $126_2$ are separated from each other.

That is, when the control signal $Se_1$ is "0," a boundary is made between the strings, and accordingly, the concatenating circuits are separated from each other.

When the stages $126_1$ and $126_2$ are separated from each other, the operation result of the AND gate $AND_1'$ is output as the detection signal $T_1$. Accordingly, when the control signals $Se_1$-$Se_6$ are "1" and the control signal $Se_7$ is "0," the same concatenating circuit as the concatenating circuit 122 shown in FIG. 3 is constructed, and the operation result $T_7$ of the AND gate $AND_7'$ is output to the output terminal of the multiplexer $MUX_7'$. At this time, the operation result $T_7$ has the same value as the detection signal $S_1$ of FIG. 3.

In this way, the concatenating unit 120b may be easily realized without newly adding a concatenating circuit whenever a new string is introduced.

Referring to FIG. 2, the index converter 130 converts the index output from the concatenating unit 120 into a string identifier (ID).

The entries contained in the CAM 110 are usually considerably greater in number than the target strings to be detected. Furthermore, with the case of FIG. 4, the detection signals $T_1$, $T_2$, . . . to be generated from the concatenating unit 120b are the same in number as the entries contained in the CAM 110. Accordingly, the index output from the concatenating unit 120b shown in FIG. 4 requires logic, which is needless in hardware, so as to express a considerably great number. As shown in FIG. 2, when the strings "pattern" and "system" are detected, the detection signals $S_1$ and $S_2$ are generated from the concatenating unit 120, and the indexes 7 and 10 corresponding to the detection signals $S_1$ and $S_2$ are representative of the two strings. Four bits are needed in order to express the two indexes 7 and 13 in a hardware manner, but when the indexes 7 and 13 are converted into the string IDs 1 and 2, the two strings are expressed by only 2 bits, thereby simplifying the hardware structure.

Furthermore, when different strings are bound into one group, the index converter 130 may grant the same string ID to the strings belonging to the group.

The string matching unit 100 may also be used to detect characteristic characters as well as to detect the characteristic strings.

Figure 5A:
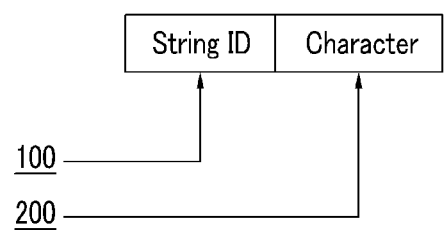
FIG. 5A and FIG. 5B illustrate a way of generating a pattern key at the key generator shown in FIG. 1, respectively.
Figure 5B:
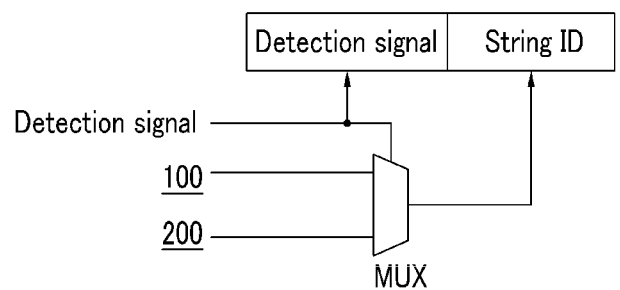

FIG. 5A and FIG. 5B illustrate a way of generating pattern keys at the key generator shown in FIG. 1, respectively.

Referring to FIG. 5A, the key generator 300 generates and outputs a pattern key containing a string ID output from the index converter 130 of the string matching unit 100, and 1-byte characters output from the delay unit 200.

By contrast, referring to FIG. 5B, as the detection signal informing of the detection of a specific string is generated from the string matching unit 100, the key generator 300 generates and outputs a string ID corresponding to the specific string as a pattern key together with the detection signal, or 1-byte characters output from the delay unit 200 as a pattern key.

That is, when a specific string is detected at the string matching unit 100, the key generator 300 outputs the detection signal and a string ID corresponding thereto as a pattern key. In other cases, the key generator 300 outputs 1-byte characters as a pattern key. Such a key generator 300 may use a multiplexer (MUX) with two input terminals connected to the string matching unit 100 and the delay unit 200, respectively.

Figure 6:
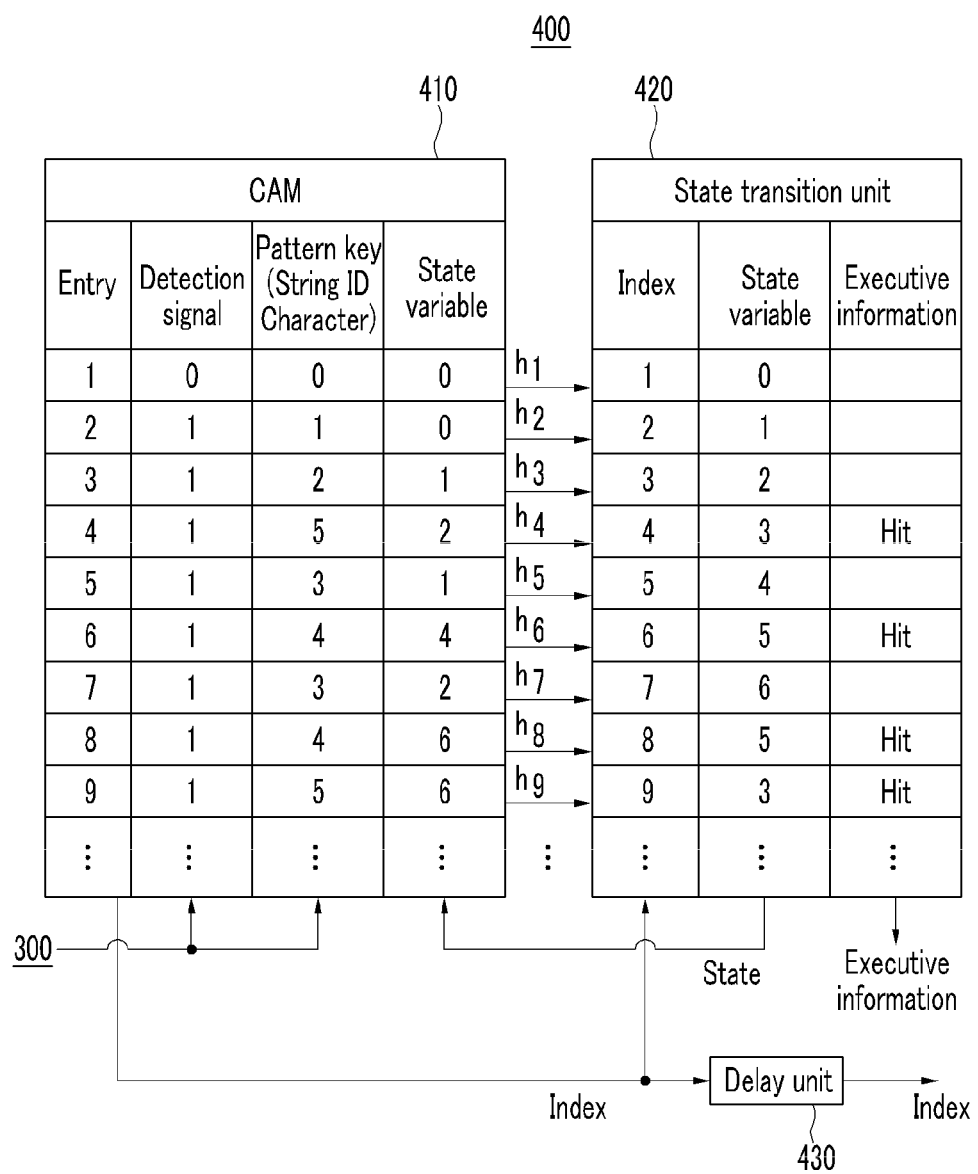
FIG. 6 illustrates an example of the regular expression matching unit shown in FIG. 1.

FIG. 6 illustrates an example of the regular expression matching unit shown in FIG. 1.

As shown in FIG. 6, the regular expression matching unit 400 includes a CAM 410, a state transition unit 420, and a delay unit 430.

The CAM 410 includes a plurality of entries. A pattern key and a state variable are stored at each entry as a content. At this time, the pattern key is generated and output from the key generator 300, and may be a string ID or character. The state variable is output from the state transition unit 420.

The CAM 410 receives the pattern key and the state variable from the key generator 300 and the state transition unit 420, respectively. The CAM 410 compares the input pattern and state variable with the contents stored at all the entries simultaneously, and when any matched entries are present, outputs the hit signals $h_1$, $h_2$, . . . corresponding to the entries.

Furthermore, the CAM 410 outputs the indexes for the entries outputting the hit signals $h_1$, $h_2$, . . . to the state transition unit 420 and the delay unit 430. Here, the index for the entry is to express the location of the relevant entry within the CAM 410 in the form of an address.

The CAM 410 may be also formed with a ternary CAM (TCAM). That is, the components of the entry like the pattern key and the state variable may be made as the "don't care" terms. Furthermore, the components of the pattern key may also be made as the "don't care" terms. For example, when it is intended irrespective of the present state to transit into the state "1" when the string "High" is detected, the state variable at the entry corresponding thereto is made as the "don't care" term. Furthermore, it is intended to transit from the state "3" or "5" where a specific pattern is detected to the initial state, irrespective of the characters or strings to be detected thereafter, the pattern key at the entry corresponding thereto is made as the "don't care" term.

The state transition unit 420 stores a state variable corresponding to the index of each entry of the CAM 410. Accordingly, the state transition unit 420 outputs the state variable corresponding to the index of the entry of the CAM 410 outputting the hit signal, to the CAM 410. For example, when the hit signal $h_2$ is output from the CAM 410, the state transition unit 420 outputs the state variable 1 corresponding to the index 2 of the entry outputting the hit signal $h_2$, to the CAM 410.

Furthermore, the state transition unit 420 may output executive information from a predetermined index. Here, the executive information may contain a hit signal informing of the detection of the target pattern, and items to be conducted at the next step when the target pattern is detected.

Figures 7, 8:
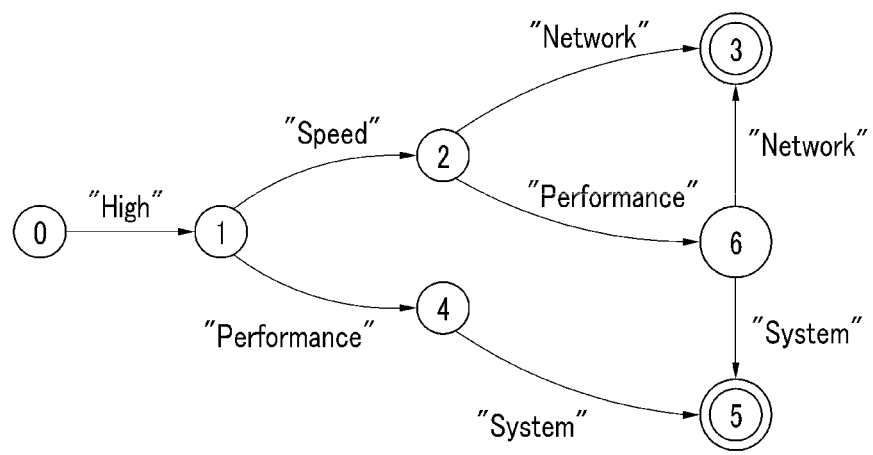
FIG. 7 illustrates an example of a state transition diagram.
FIG. 8 is a schematic diagram of string IDs corresponding to the strings shown in FIG. 7.

For example, when it is intended to detect a pattern 1 where the strings "High," "Speed," "Network," etc. are sequentially generated and a pattern 2 where "High", "Performance," "System," etc. are sequentially generated, the predictable state transition diagram may be illustrated by FIG. 7.

FIG. 7 illustrates a state transition diagram according to an exemplary embodiment of the present invention, and FIG. 8 is a schematic diagram illustrating string IDs corresponding to the strings illustrated in FIG. 7.

Referring to FIG. 7, the state transition unit 420 transits into the state 1 when the string "High" is detected at the state 0, while it transits into the state 2 when the string "Speed" is detected at the state 1, and into the state 3 when the string "Network" is detected at the state 2. As the state 3 means that the pattern 1 is detected, the state transition unit 420 outputs a hit signal informing of the detection of the target pattern as the executive information for the state 3.

Furthermore, the state transition unit 420 transits into the state 4 when the string "Performance" is detected at the state 1, and into the state 5 when the string "System" is detected at the state 4. As the state 5 means that the pattern 2 is detected, the state transition unit 420 outputs a hit signal informing of the detection of the target pattern as the executive information for the state 5.

The state transition diagram may further include a state transition like a state 6 to be additionally generated. Furthermore, various types of state transitions other than those illustrated in FIG. 7 may be made.

Referring to FIG. 8, when the string IDs expressed in FIG. 8 are attributed to the respective strings expressed in FIG. 7, the state transition diagram of FIG. 7 may be constructed as with FIG. 6.

When the data stream "A High Speed and Performance Pattern Matching System for Network Security" is input into the pattern matching system 10 according to an exemplary embodiment of the present invention, it may be analyzed as below with reference to FIG. 6 and FIG. 7. It is assumed that the data stream is input into the pattern matching system 10 for the first time.

As the string "High" is detected at the state 0, the CAM 410 outputs a heat signal $h_2$ and an index 2 corresponding to the entry outputting the hit signal $h_2$, to the state transition unit 420. The state transition unit 420 transits from the state 0 to the state 1 corresponding to the index 2, and transmits the information on the state 1 to the CAM 410.

When the string "Speed" is detected at the state 1, the CAM 410 outputs a hit signal $h_3$ and an index 3 corresponding to the entry outputting the hit signal $h_3$, to the state transition unit 420. The state transition unit 420 transits from the state 1 to the state 2 corresponding to the index 3, and transmits the information on the state 2 to the CAM 410.

Thereafter, when the string "Performance" is detected at the state 2, the CAM 410 outputs a hit signal $h_7$ and an index 7 corresponding to the entry outputting the hit signal $h_7$, to the state transition unit 420. The state transition unit 420 transits from the state 2 to the state 6 corresponding to the index 7, and transmits the information on the state 6 to the CAM 410.

Thereafter, when the string "System" is detected at the state 6, the CAM 410 outputs a hit signal $h_8$ and an index 8 corresponding to the entry outputting the hit signal $h_8$, to the state transition unit 420. The state transition unit 420 transits from the state 6 to the state 5 corresponding to the index 8. At this time, as the state 5 means that the pattern 2 is detected, the state transition unit 420 outputs a hit signal as the executive information on the state 5 while transiting into the state 5.

Referring to FIG. 6 again, the delay unit 430 delays the index output from the CAM 410 by the time required for outputting the hit signal at the state transition unit 420, and outputs it.

The regular expression matching unit 400 may have a structure different from the structure illustrated in FIG. 6.

Figure 9:
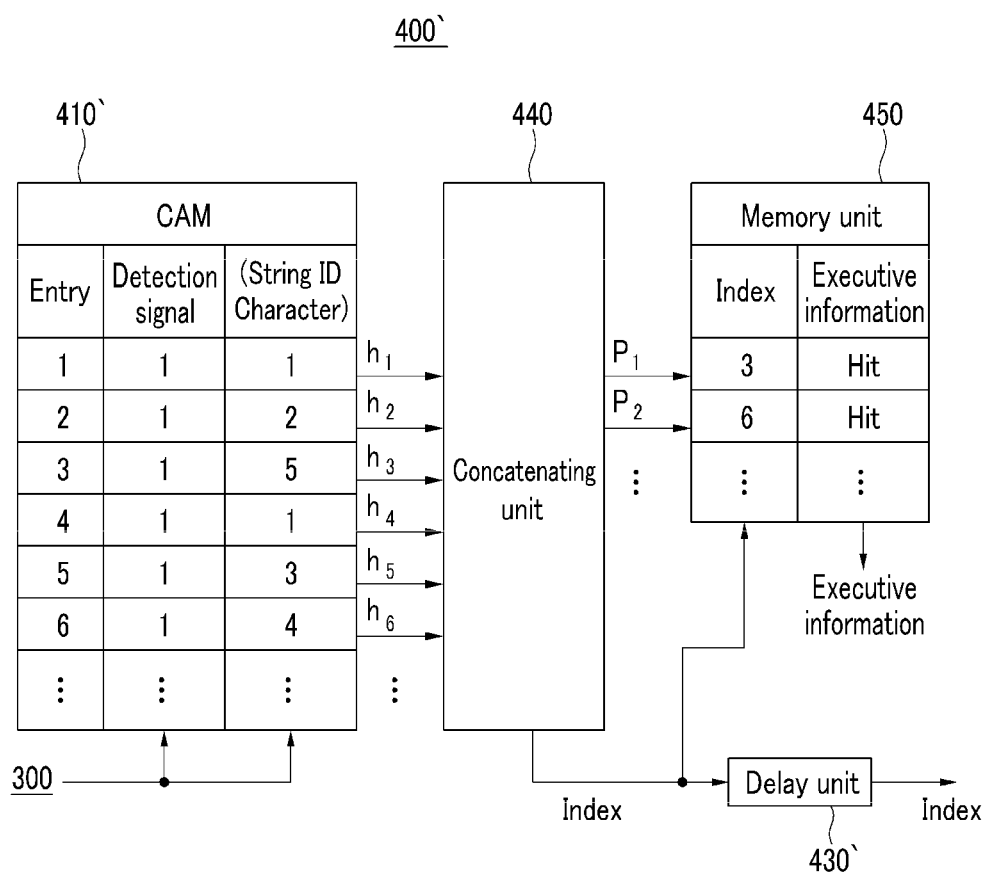
FIG. 9 illustrates another example of the regular expression matching unit shown in FIG. 1.

FIG. 9 illustrates another example of the regular expression matching unit shown in FIG. 1.

Referring to FIG. 9, the regular expression matching unit 400' includes a CAM 410', a concatenating unit 440, and a memory unit 450.

The CAM 410' includes a plurality of entries. A pattern key is stored at each entry as a content. The pattern key is generated and output from the key generator 300, and may be a string ID or a character.

The CAM 410 receives a pattern key from a key generator 300, and compares the input pattern key with the contents stored at all the entries simultaneously. When any matched entries are present, hit signals $h_1, h_2, \ldots$ corresponding to the entries are output.

The concatenating unit 440 logically combines the hit signals $h_1, h_2, \ldots$ sequentially output from the respective entries of the CAM 410, and generates detection signals $P_1, P_2, \ldots$ informing of the detection of the pattern. That is, when characters or strings forming a pattern from the first character or string to the last character or string of the target pattern to be detected are sequenced temporally, the concatenating unit 440 generates detection signals $P_1, P_2, \ldots$ informing of the detection of the pattern.

The concatenating unit 440 converts the detection signals $P_1, P_2, \ldots$ into indexes, and outputs them to the index converter 130.

Figure 10:
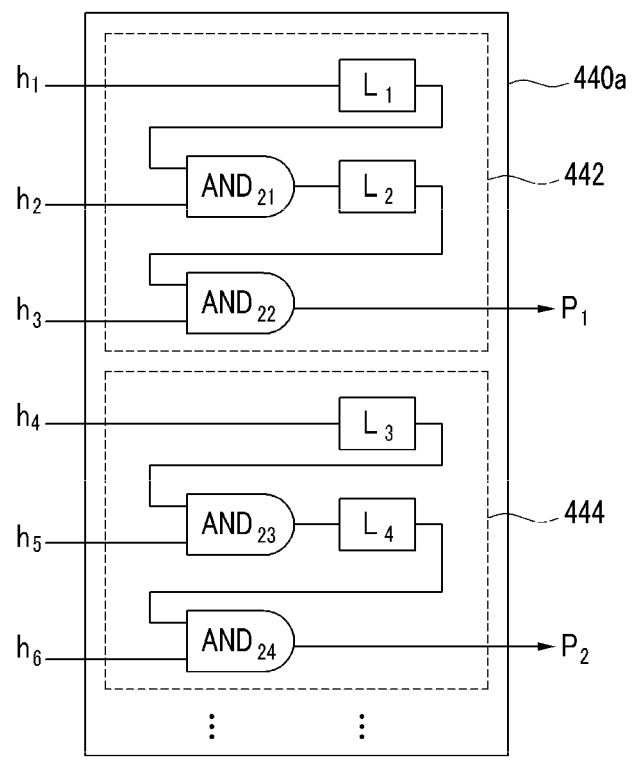
FIG. 10 illustrates an example of the concatenating unit shown in FIG. 9.
Figure 11:
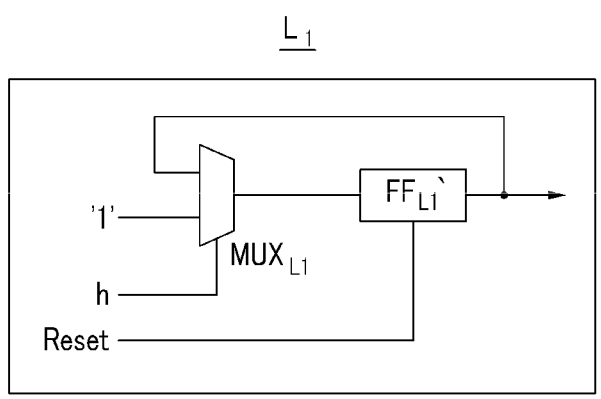
FIG. 11 illustrates a latch shown in FIG. 10.

FIG. 10 illustrates an example of the concatenating unit shown in FIG. 9, and FIG. 11 illustrates the latch shown in FIG. 10. FIG. 10 illustrates the concatenating unit 120a while assuming that when the target patterns are a pattern 1 where the strings "High," "Speed," and "Network" are sequentially generated and a pattern 2 where the strings "High," "Performance," and "System" are sequentially generated, hit signals corresponding to the strings "High," "Speed," and "Network" and the strings "High," "Performance," and "System" are sequentially output from the CAM 410. Furthermore, FIG. 11 illustrates only one latch $L_1$ among a plurality of latches $L_1$-$L_4$, and the other latches $L_2$-$L_4$ may be structured likewise.

Referring to FIG. 10, the concatenating unit 440a includes a concatenating circuit 442/444 formed corresponding to the target pattern to be detected.

The concatenating circuit 442/444 includes a plurality of latches $L_1$-$L_4$ and a plurality of AND gates $AND_{21}$-$AND_{24}$. The concatenating circuit 442/444 has a structure similar to that of the concatenating circuit 122/124 shown in FIG. 3 except that the flip-flop of the concatenating circuit 122/124 shown in FIG. 3 is replaced by a latch.

The respective latches $L_1$-$L_4$ have an input terminal, two control terminals, and an output terminal. When one piece of data is input into the input terminal, the input data is sustained before the next piece of data is input, and the input terminal outputs it to the output terminal.

Referring to FIG. 11, the latch $L_1$ includes a multiplexer $MUX_{L1}$ and a flip-flop $FF_{L1}$. One of the two input terminals of the multiplexer $MUX_{L1}$ (referred to hereinafter as "first input terminal") is connected to the output terminal of the flip-flop $FF_{L1}$, and the output terminal of the multiplexer $MUX_{L1}$ is connected to the input terminal of the flip-flop $FF_{L1}$. The control terminal of the multiplexer $MUX_{L1}$ forms the control terminal of the latch $L_1$, and a control terminal h is input into the control terminal. The other input terminal of the multiplexer $MUX_{L1}$ (referred to hereinafter as "second input terminal") forms the input terminal of the latch $L_1$, and the output terminal of the flip-flop $FF_{L1}$ forms the output terminal of the latch $L_1$.

The multiplexer $MUX_{L1}$ outputs the data of the first or second input terminal in accordance with the control signal h. For example, when the control signal h is "1," the multiplexer $MUX_{L1}$ outputs the data of the second input terminal, while when the control signal h is "0," the multiplexer $MUX_{L1}$ outputs the data of the first input terminal.

As shown in FIG. 11, assuming that "1" is input into the second input terminal of the multiplexer $MUX_{L1}$, when the control signal h is "1,", "1" is input into the flip-flop $FF_{L1}$, and the flip-flop $FF_{L1}$ outputs the input "1."

When the control signal h is "0," the "1" output to the output terminal of the flip-flop $FF_{L1}$ is again input into the flip-flop $FF_{L1}$. Accordingly, the output of the flip-flop $FF_{L1}$ is kept to be "1."

Furthermore, the latch $L_1$ may additionally include means for altering the output value into "0."

That is, when a reset signal Reset is input into the flip-flop $FF_{L1}$, the flip-flop $FF_{L1}$ outputs "0."

That is, the latches $L_1$-$L_4$ conduct the function similar to that of the flip-flops $FF_1$-$FF_{12}$, $FF_4'$-$FF_{12}'$ shown in FIG. 3 and FIG. 4. Accordingly, the operation of the concatenating circuit 442/444 of the concatenating unit 440a is the same as that of the concatenating circuit 122/124 of the concatenating unit 120a shown in FIG. 3.

For example, when it is intended to detect a pattern 1 where the strings "High," "Speed," and "Network" are sequentially generated and a pattern 2 where the strings "High," "Performance," and "System" are sequentially generated, it is assumed that the string IDs shown in FIG. 8 are granted to the respective strings contained in the two patterns, and as shown in FIG. 9, the string IDs are sequentially stored at the CAM 410.

When the strings contained in the pattern 1 or the pattern 2 are sequentially detected, the CAM 410 sequentially outputs hit signals $h_1$, $h_2$, . . . corresponding thereto.

First, when the string "High" is input, the CAM 410' outputs a hit signal $h_1$ to the latch $L_1$. The latch $L_1$ sustains the hit signal $h_1$ until the next hit signal $h_2$ is input, and then outputs it. Thereafter, when the string "Speed" is input, the CAM 410' outputs the hit signal $h_2$ to the AND gate $AND_{11}$. At this time, the latch $L_1$ outputs the hit signal $h_1$ to the AND gate $AND_{11}$. The AND gate $AND_{11}$ AND-calculates the two hit signals $h_1$ and $h_2$, and outputs the product to the latch $L_2$. The latch $L_2$ sustains the product of two hit signals $h_1$ and $h_2$ until the next hit signal $h_3$ is input, and then outputs it.

Thereafter, when the string "Network" is input, the CAM 410' outputs a hit signal $h_3$ to the AND gate $AND_1$. The AND gate $AND_{12}$ AND-calculates the product of two hit signals $h_1$ and $h_2$ by the hit signal $h_3$, and outputs the product. At this time, the value output from the AND gate $AND_{12}$ becomes the detection signal P1 informing of the detection of the pattern 1.

Figure 12:
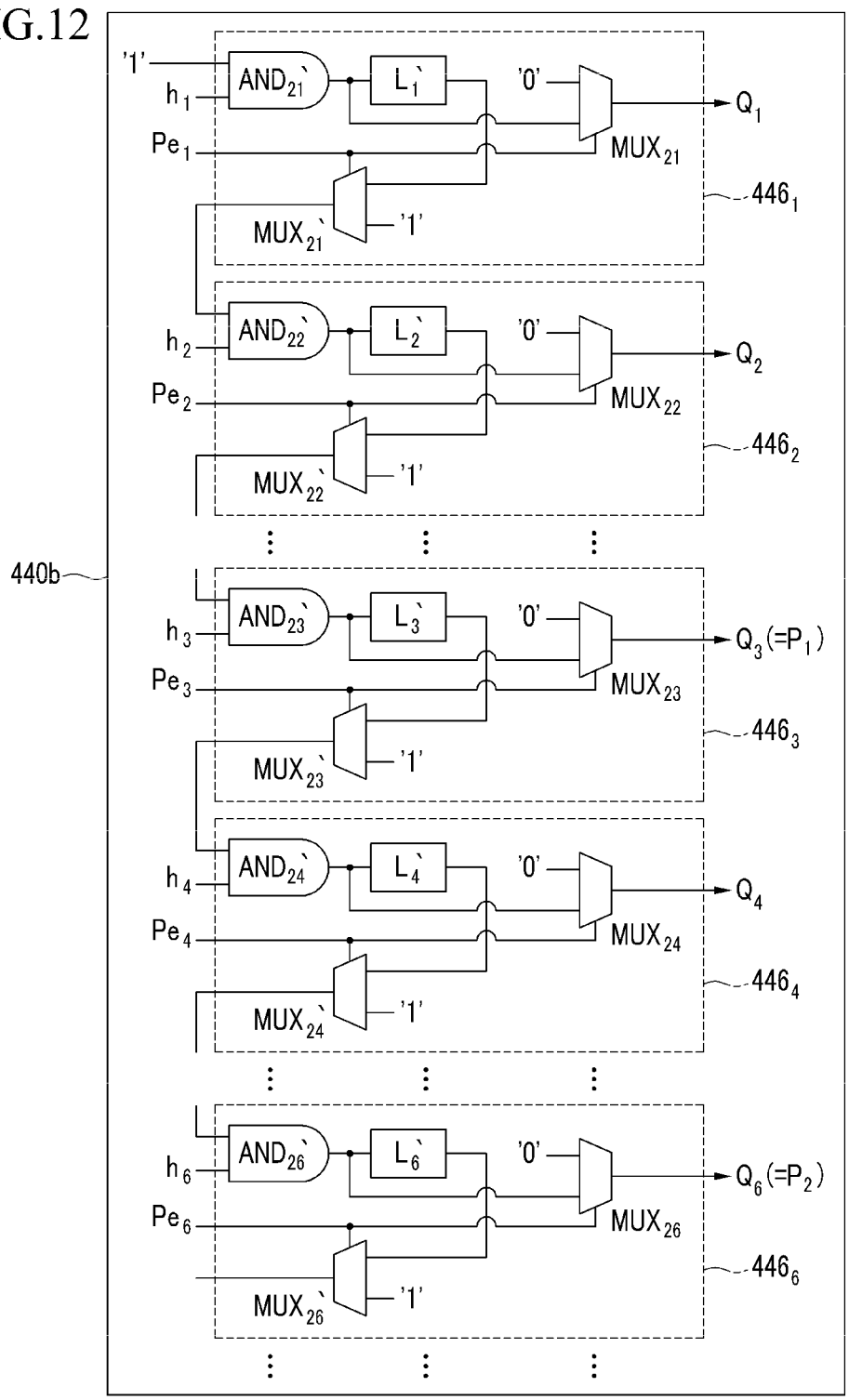
FIG. 12 illustrates another example of the concatenating unit shown in FIG. 9.

FIG. 12 illustrates another example of the concatenating unit shown in FIG. 9.

Referring to FIG. 12, the concatenating unit 440b includes a plurality of stages $446_1$-$446_6$, and the respective stages $446_1$-$446_6$ include an AND gate $AND_{21}'/AND_{26}'$, a latch $L_1'/ . . . /L_6'$, a first multiplexer $MUX_{21}/ . . . /MUX_{26}$, and a second multiplexer $MUX_{21}'/ . . . /MUX_{26}'$. The respective stages $446_1$-$446_6$ have a structure similar to that of the respective stages $126_1$-$126_{13}$ shown in FIG. 4 except that the flip-flop of the respective stages $126_1$-$126_{13}$ is replaced by a latch. Accordingly, the concatenating unit 440b is similar in operation to the concatenating unit 120b shown in FIG. 4.

For example, when the control signal $Pe_1$ is "1," the multiplexer $MUX_{21}'$ outputs the data of the first input terminal. Therefore, the output terminal of the latch $L_1'$ is connected to the input terminal of the AND gate $AND_{22}'$ so as to form a concatenating circuit. By contrast, when the control signal $Pe_1$ is "0," the multiplexer $MUX_{21}'$ outputs the data of the second input terminal. Therefore, the output terminal of the latch $L_1'$ is not connected to the input terminal of the AND gate $AND_{22}'$. That is, the stage $446_1$ and the stage $446_2$ are separated from each other. At this time, the operation result of the AND gate $AND_{21}'$ is output as the detection signal $Q_1$ of the concatenating unit 440b.

Accordingly, when the control signals $Pe_1$ and $Pe_2$ are "1" and the control signal $Pe_3$ is "0," the same concatenating circuit as the concatenating circuit 442 shown in FIG. 10 may be constructed. At this time, the product of the AND gate $AND_{23}'$ is output to the output terminal of the multiplexer $MUX_{23}$ as the detection signal $Q_3$ of the concatenating unit 440b, and the detection signal $Q_3$ has the same value as the detection signal $P_1$ of FIG. 10.

Referring to FIG. 9 again, the memory unit 450 outputs executive information corresponding to the index output from the concatenating unit 440. The executive information contains a hit signal informing of the detection of the target pattern, and items to be conducted at the next step pursuant to the detection of the target pattern.

Finally, the delay unit 430' delays the relevant index by the time required for processing the index and outputting the executive information thereon at the memory unit 450, and outputs it.

The above-described exemplary embodiments of the present invention is realized not only by way of a system and a method, but only by way of a program conducting the functions corresponding to the structural features according to the exemplary embodiments of the present invention or a program-recorded medium, and such a realization is easily made by those skilled in the art based on the described embodiments.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of matching a pattern in a pattern matching system, the pattern matching method comprising:
   detecting strings contained in a target pattern to be detected within a data stream input by 1-byte data;
   delaying the input of the 1-byte data;
   generating pattern keys by using the detected strings and the delayed 1-byte data; and
   detecting a regular expression representing the target pattern among regular expressions constructed by the generated pattern keys.

2. The pattern matching method of claim 1, wherein the pattern matching system comprises a content addressable memory (CAM) where characters corresponding to the strings contained in the target pattern to be detected are stored at a plurality of entries as contents, and the detecting the strings comprises:
   comparing the data stream input by 1-byte with the characters stored at the plurality of entries;
   generating hit signals corresponding to entries storing characters matched to the input 1-byte data among the plurality of entries; and generating a detection signal informing of a detection of a string contained in the target pattern to be detected when the hit signals are sequentially generated.

3. The pattern matching method of claim 2, wherein the detecting the strings further comprises:
generating an index corresponding to the detection signal; and
converting the index into a string identification (ID).

4. The pattern matching method of claim 3, wherein the generating the pattern keys comprises:
when the string contained in the target pattern to be detected is detected, generating the detection signal and a string ID corresponding to the detected string as a pattern key; and
when the string contained in the target pattern is not detected, generating the delayed 1-byte data as a pattern key.

5. The pattern matching method of claim 1, wherein the pattern matching system comprises a content addressable memory (CAM) storing pattern keys at a plurality of entries as contents, and the detecting the regular expression comprises:
comparing the generated pattern keys with the contents stored at the plurality of entries;
generating a hit signal corresponding to an entry storing content matched to a generated pattern key among the plurality of entries; and
when hit signals are sequentially generated, generating a hit signal informing of a detection of the pattern.

6. The pattern matching method of claim 1, wherein the pattern matching system comprises a content addressable memory (CAM) where pattern keys and state variables are stored at a plurality of entries as contents, and a state transition unit storing state variables corresponding to indexes for the plurality of entries, and the detecting the regular expression comprises:
comparing an input pattern key and an input state variable with the contents stored at the plurality of entries;
generating a hit signal corresponding to an entry storing content matched to the input pattern key and the input state variable among the plurality of entries;
outputting an index for the entry corresponding to the hit signal; and
inputting a state variable corresponding to the output index.

7. The pattern matching method of claim 6, wherein the detecting the regular expression further comprises outputting executive information corresponding to a specific index among the indexes corresponding to the plurality of entries, the executive information containing a hit signal informing of a detection of the target pattern.

8. A non-transitory computer readable medium stored thereon a program that, when executed by a computer, causes the computer to execute a pattern matching system comprising:
a string matching unit detecting strings contained in a target pattern to be detected within a data stream input by 1-byte data;
a delay unit delaying the input of the 1-byte data;
a key generator generating pattern keys by using the detected strings and the delayed 1-byte data; and
a regular expression matching unit detecting a regular expression representing the target pattern to be detected among regular expressions constructed by the pattern keys.

9. The medium of claim 8, wherein the string matching unit comprises:
a content addressable memory (CAM) having a plurality of entries, each of which stores a character as a content, and generating a hit signal corresponding to an entry storing a character matched to the input 1-byte data among the plurality of entries;
a concatenating unit generating a detection signal informing of a detection of a string contained in the target pattern when hit signals are sequentially generated and outputting an index corresponding to the detection signal; and
an index converter converting the index into a string ID.

10. The medium of claim 9, wherein the strings to be detected are divided into a plurality of groups, and the index converter converts an index for strings belonging to a same group into a same string ID.

11. The medium of claim 9, wherein the concatenating unit comprises a plurality of first input terminals receiving hit signals corresponding to respective characters of the strings contained in the target pattern to be detected, and a plurality of concatenating circuits having first output terminals for outputting the detection signal,
wherein the concatenating circuits comprise:
a plurality of flip-flops each having a second input terminal and a second output terminal; and
a plurality of logic gates each having third and fourth input terminals and a third output terminal,
wherein the second output terminal of the respective flip-flop is connected to the third input terminal of a respective logic gate, and the third output terminals of the plurality of logic gates except for a last-positioned logic gate among the plurality of logic gates are connected to the second input terminals of the plurality of flip-flops except for a foremost-positioned flip-flop among the plurality of flip-flops, and
wherein the third output terminal of the last-positioned logic gate forms a first output terminal, and the second input terminal of the foremost-positioned flip-flop and the fourth input terminals of the plurality of logic gates form the plurality of first input terminals.

12. The medium of claim 9, wherein the concatenating unit comprises a plurality of concatenating circuits corresponding to the strings contained in the target pattern to be detected, respectively, and the respective concatenating circuits comprise a plurality of stages each having first and second input terminals, first and second output terminals, and a control signal,
wherein the first input terminal of the respective stages is connected to the second output terminal of a stage neighboring thereto, and the second input terminal of the respective stages receives hit signals corresponding to respective characters of the strings contained in the target pattern to be detected, while a control terminal of the respective stages receives a control signal, and a first output terminal thereof outputs a detection signal, and
wherein stage neighbors are separated from each other by way of at least one of the control signals.

13. The medium of claim 12, wherein the respective stages comprise:
a logic gate AND calculating data input into the first and second input terminals and outputting the AND calculated data to at least one of the first and second output terminals;
a flip-flop having an input terminal connected to an output terminal of the logic gate, and an output terminal;

a first multiplexer having a third input terminal receiving first data, a fourth input terminal connected to the output terminal of the logic gate, and a third output terminal forming the first output terminal; and a second multiplexer having a fifth input terminal connected to the output terminal of the flip-flop, a sixth input terminal receiving second data, and a fourth output terminal forming the second output terminal.

14. The medium of claim 8, wherein the regular expression matching unit comprises:

a CAM having a plurality of entries, each of which stores a pattern key and a state variable as a content, generating a first hit signal corresponding to an entry storing a pattern key matched to a pattern key generated from the key generator among the plurality of entries, and outputting an index corresponding to the entry corresponding to the first hit signal; and a state transition unit storing state variables, each of which corresponding to an index for each of the plurality of entries, and outputting a state variable corresponding to an index output from the CAM to the CAM, wherein the state transition unit outputs executive information corresponding to a specific index among the indexes for the plurality of entries, and the executive information contains a second hit signal informing of a detection of the target pattern.

15. The medium of claim 8, wherein the regular expression matching unit comprises:

a CAM having a plurality of entries, each of which stores a pattern key as a content, and outputting a hit signal corresponding to an entry storing a pattern key matched to a pattern key generated from the key generator among the plurality of entries;

a concatenating unit generating a detection signal informing of detection of the target pattern when hit signals are sequentially output and outputting an index corresponding to the detection signal; and a memory unit outputting executive information corresponding to the index.

16. The medium of claim 15, wherein the concatenating unit comprises a plurality of concatenating circuits having a plurality of first input terminals receiving hit signals corresponding to the strings contained in the target pattern, and a first output terminal outputting the detection signal, wherein the concatenating circuits comprise a plurality of latches each with a second input terminal and a second output terminal, and a plurality of logic gates each with third and fourth input terminals and a third output terminal, wherein the second output terminal of the respective latches is connected to the third input terminal of the respective logic gates, and the third output terminals of the logic gates except for last-positioned logic gate among the plurality of logic gates are connected to the second input terminals of the plurality of latches except for a foremost-positioned latch among the plurality of latches, and wherein the third output terminal of the last-positioned logic gate forms the first output terminal, and the second input terminal of the foremost-positioned latch and the fourth input terminal of the respective logic gates form the plurality of first input terminals.

17. The medium of claim 15, wherein the concatenating unit comprises a plurality of concatenating circuits corresponding to the strings contained in the target pattern, respectively, wherein the concatenating circuits comprise a plurality of stages each having first and second input terminals, first and second output terminals, and a control terminal, wherein the first input terminal of the respective stages is connected to the second output terminal of a stage neighboring thereto, wherein the second input terminal of the respective stages receives a hit signal outputted from the CAM, while the control terminal of a stage receives a control signal, and the first output terminal thereof outputs the detection signal, and wherein stage neighbors are separated from each other by way of at least one control signal.

18. The medium of claim 17, wherein the respective stages comprise:

a logic gate AND calculating data input into the first and second input terminals and outputting the AND calculated data to at least one of the first and second output terminals;

a latch having an input terminal connected to an output terminal of the logic gate, and an output terminal;

a first multiplexer having a third input terminal receiving first data, a fourth input terminal connected to the output terminal of the logic gate, and a third output terminal forming the first output terminal; and a second multiplexer having a fifth input terminal connected to the output terminal of the latch, a sixth input terminal receiving a second data, and a fourth output terminal forming the second output terminal.

19. The medium of claim 18, wherein the latch comprises:

a third multiplexer having two input terminals and an output terminal; and a flip-flop having an input terminal connected to the output terminal of the third multiplexer and an output terminal connected to one of the two input terminals of the third multiplexer, wherein the other input terminal of the third multiplexer forms an input terminal of the latch.

20. The medium of claim 19, wherein the flip-flop further comprises a control terminal receiving a reset signal.

* * * * *